United States Patent [19]

Brannon et al.

[11] Patent Number: 5,452,173
[45] Date of Patent: Sep. 19, 1995

[54] DIAGNOSTIC CIRCUIT PROTECTION DEVICE

[75] Inventors: C. Tom Brannon, Houston; Goeffrey Eastham, Missouri City, both of Tex.

[73] Assignee: Challenge Technologies, Inc., Houston, Tex.

[21] Appl. No.: 940,921

[22] Filed: Sep. 8, 1992

[51] Int. Cl.[6] .................................. H02H 3/247
[52] U.S. Cl. ........................... 361/94; 361/90; 361/97; 364/483
[58] Field of Search ............................ 361/85–87, 361/90, 94, 103, 106, 18, 97; 364/483, 481

[56] References Cited

U.S. PATENT DOCUMENTS

| | | | |
|---|---|---|---|
| 3,781,636 | 12/1973 | Genuit et al. | 321/9 R |
| 3,793,559 | 2/1974 | Ristuccia | 317/14 R |
| 4,210,947 | 7/1980 | Koizumi | 361/18 |
| 4,612,617 | 9/1986 | Laplace, Jr. et al. | 364/483 |
| 4,727,448 | 2/1988 | Hanyuda et al. | 361/18 |
| 4,965,692 | 10/1990 | Burns et al. | 361/18 |
| 4,989,155 | 1/1991 | Begin et al. | 364/483 |
| 5,136,458 | 8/1992 | Durivage, III | 361/93 |

*Primary Examiner*—Todd DeBoer
*Attorney, Agent, or Firm*—Conley, Rose & Tayon

[57] ABSTRACT

A circuit protection device for use with an electrical unit comprises driver circuitry connected to the electrical unit and connecting means electrically connecting the device to the electrical unit to provide a voltage signal indicative of a voltage associated with the electrical unit. A voltage detector is connected to the connecting means and receives the voltage signal, and provides a conditioned voltage signal output representative of the voltage signal. An analog-to-digital converter receives the conditioned voltage signal output and converts the conditioned voltage signal output to a digital value. A digital processing device receives the digital value from the analog-to-digital converter and provides an output signal to the driver circuitry to turn off power to the primary if an error is detected. The device may also include current obtaining means for providing an electrical signal indicative of a current associated with the electrical unit, and a current detector circuit connected to and receiving that electrical signal for providing an output voltage signal representative thereof. Multiplexing means may be provided for receiving the output signals from both the voltage detector and the current detector for selectively connecting only one of those signals at a time to the analog-to-digital converter. Alternatively, a second analog-to-digital converter may receive the second output voltage signal and convert it to a digital value, and the digital processing device may receive and process the digital values from both analog-to-digital converters.

22 Claims, 13 Drawing Sheets

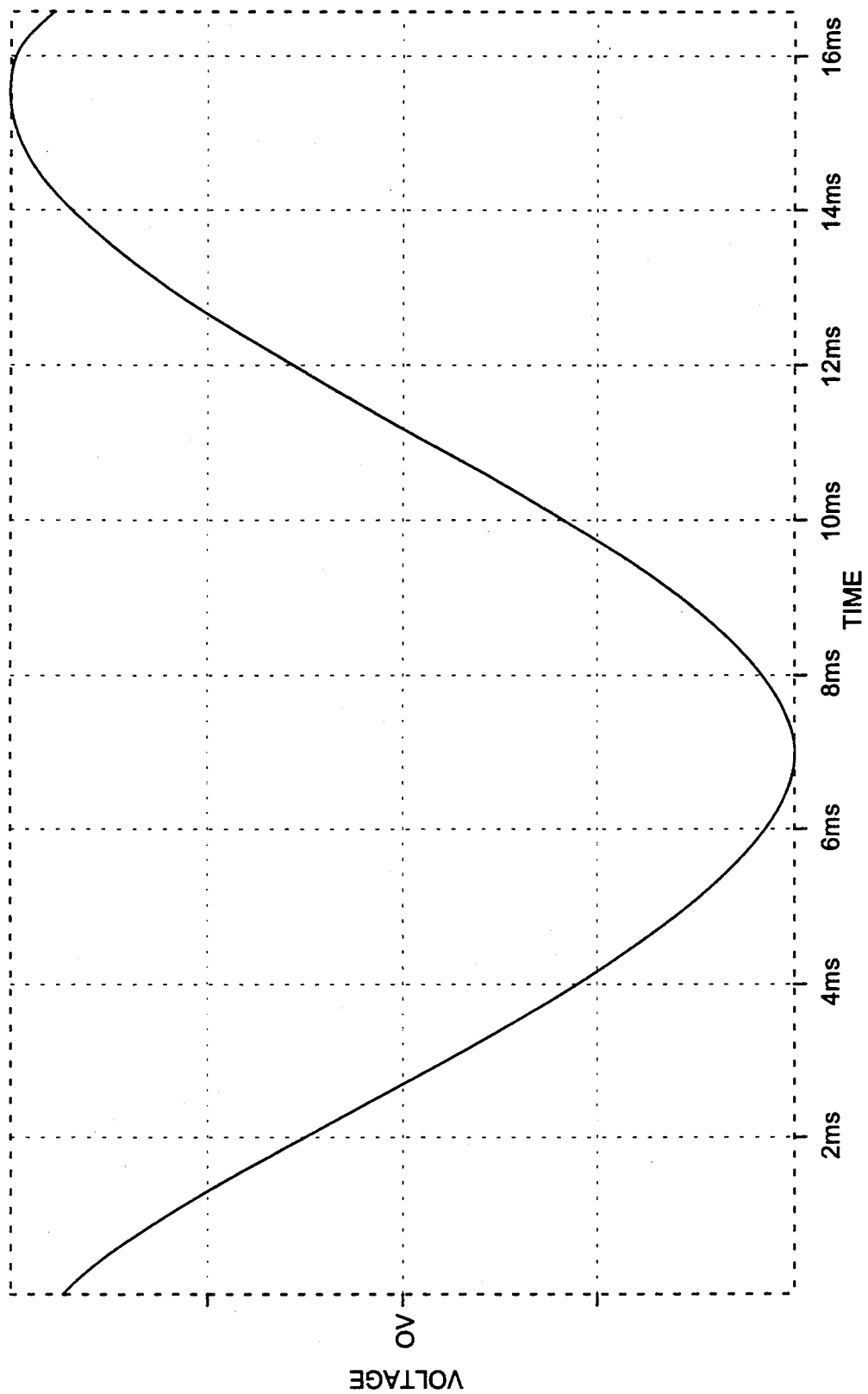
FIG. 3 (PRIMARY VOLTAGE)

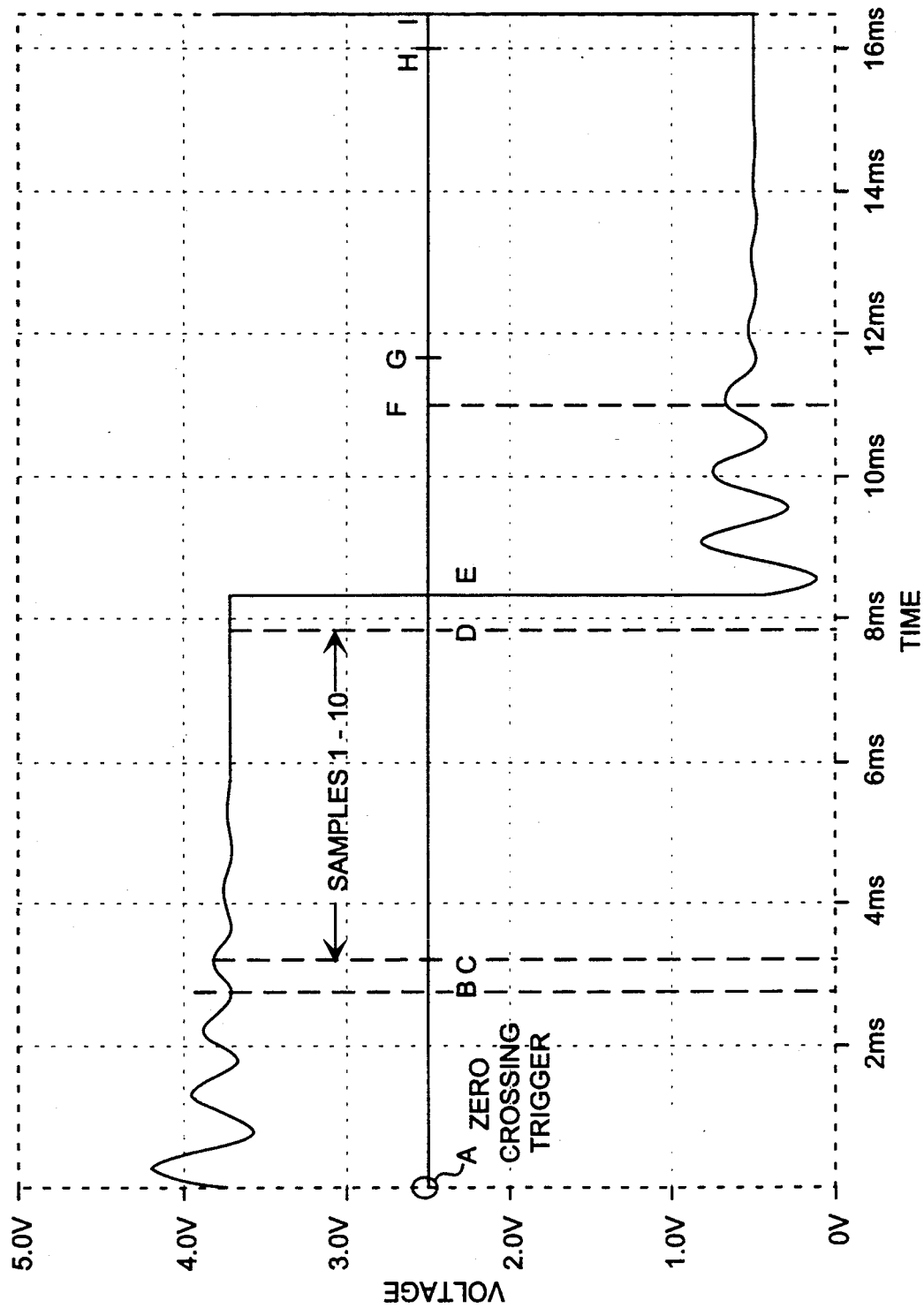
FIG. 4 (DETECTOR VOLTAGE)

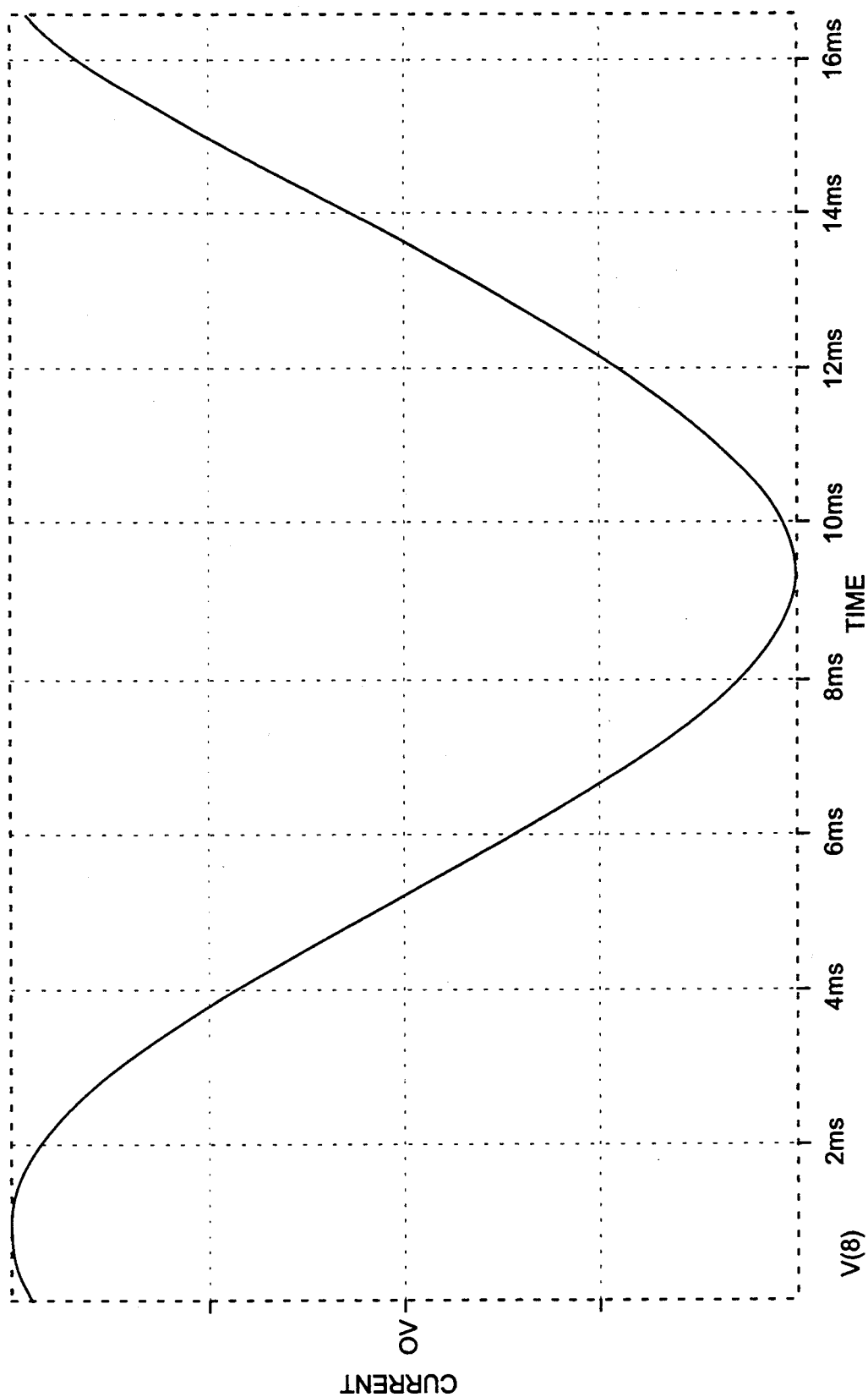
FIG. 5 (DETECTOR CURRENT)

DIAGNOSTIC CIRCUIT PROTECTION DEVICE

BACKGROUND OF THE INVENTION

This invention relates generally to circuitry for protecting devices which receive a periodic input power signal, as generally described in commonly assigned application Ser. No. 07/580,957, now abandoned. More particularly, the present invention relates to diagnostic circuit protection devices which can be calibrated to protect a particular load or circuit.

There are circumstances under which fuses, circuit breakers, ground fault interrupters, or other currently used protection circuits do not provide adequate hazard and device protection. These presently used devices are not sensitive to all possible fault conditions. Sometimes the fault condition is such that it requires a power shut off time much shorter than these devices can provide, in order to prevent a hazard or equipment damage.

The present invention can be used in place of a fuse or a circuit breaker and provides protection under a broader range of conditions than do fuses, circuit breakers, ground fault interrupters, or other currently existing protection devices. It is capable of adapting to the fault conditions presented by the system in which it is installed. Unlike other protection devices, the present invention does not rely on built in fault limits. It is adaptable to the protection of common household appliances, air-conditioning units, light fixtures, medical instruments, and many other electrical units. Because it can be calibrated at the time of installation, it can be used with all types of electrical units as an add on device.

One inadequacy with currently available protection devices is their lack of flexibility in adapting to the peculiarities of the electrical system in which they are installed. Most protection devices are calibrated at the factory to protect at a single, preset fault limit. This is generally true of fuses, circuit breakers, and ground fault circuit interrupters. Similarly, electronic protection devices tend to be custom-designed to work with the power supply with which they are used. They are usually an integral part of the power supply design, and are not adaptable for use as an 'add on' device to an existing electrical system.

The typical electrical system comprises either a power source connected directly to the electrical unit (the load), or a power source coupled to the electrical unit through a matching device. The matching device comprises a device, such as a transformer, or a circuit comprised of other components. When used, its input is connected to the power source and its output is connected to the electrical unit.

Thus, one type of electrical system may comprise an alternating current power source coupled to an electrical unit through a transformer. The power source may be a standard United States alternating current source or may be a source conforming to a European or other standard. The transformer may be chosen from a variety of types, ratings, and constructions. A transformer is selected to match the power source to the load characteristics of the particular electrical unit to provide proper operating power. This is done by using a transformer with specific voltage and current ratings. The load characteristics of an electrical unit depend, among other things, on its type, physical configuration, and on the ambient conditions in its operating environment.

Proper installation, maintenance, and hazard protection of electrical systems is crucial to their safety and longevity. Currently, there are inadequacies in all three of these areas. The chief problems that an electrical system can suffer from are: (1) overloading; (2) underloading; (3) an imbalanced load (or electrical unit); (4) open circuits in the electrical unit; (5) short circuits in the electrical unit; (6) arcing; (7) power surges in the primary circuit; and (8) over-temperature conditions in either the matching device or the electrical unit. The present invention can either avoid or solve these problems for many systems. For example, the present invention can solve these problems in an electrical system comprising a gaseous light fixture, as discussed below.

Gaseous light fixtures are used in numerous commercial and residential applications. Neon sign and fluorescent light installations are common examples. The typical gaseous light fixture consists of an alternating current power source coupled to a luminous device through a transformer. The power source and load can vary as indicated above. For instance, the load characteristics of a luminous device depend on its type, physical configuration, and on the ambient conditions in its operating environment.

During fixture operation, the transformer steps up the source voltage connected to its primary coil and puts out a secondary coil voltage that is high enough to ionize the gas in the luminous device. The secondary voltage in a light fixture typically ranges from 110 volts to 15,000 volts, depending on the load characteristics of the luminous device. Many fixtures use a particular type of transformer called a luminous tube transformer.

A luminous tube transformer has a special shunt winding which will limit the output current to a maximum given level. The output current level depends on the instantaneous load conditions presented by the luminous device. Typically, luminous tube transformers for use with neon lights are designed to limit the output current to a maximum given level of 30 mA or 60 mA. In fluorescent light fixtures the maximum output current level of the ballast is typically around 800 mA. As described in commonly assigned patent application Ser. No. 07/580,957, the use of a luminous tube transformer in the fixture renders fuses, circuit breakers, and ground fault interrupters useless for detecting certain types of faults and preventing the hazards associated therewith.

The load characteristics for a given luminous device may vary considerably from those of other luminous devices of the same type. The variation may be due to any combination of differences in size, construction, or materials used. Changes in ambient temperature also change the load characteristics. Load characteristics also vary among the various types of luminous devices.

The transformer should be chosen to match the load at the time of installation. A properly loaded transformer has a longer service life, conserves electrical power, and maximizes the economic use of natural resources. Proper loading also promotes smoother operation over a range of varying conditions, such as large changes in temperature. A transformer is typically chosen so that it operates at 80% of its maximum rating when attached to a particular luminous device. The transformer has a shorter service life when overloaded or underloaded relative to this value. Transformer matching presents several problems.

To match the transformer, the sign maker estimates the necessary voltage and current ratings of the transformer based on the type, size, and configuration of the luminous device. Occasionally this choice is confirmed in the lab, but usually it is not confirmed. The transformer is then shipped along with the luminous device.

During installation of the fixture, an ammeter is sometimes temporarily inserted in the secondary coil circuit to verify proper matching of the transformer to the load, or to detect an improper load condition. The current draw should be approximately 80% of the transformer's maximum current rating. However, technicians often omit this cumbersome procedure and simply install the fixture. Thus, it is rare that proper matching is checked at any time prior to or during installation. Even when an ammeter is used, it only gives a current reading, but does not directly indicate to the technician any information about proper loading.

At the time of installation, the fixture can suffer from three distinct problems: (1) an overloaded transformer; (2) an underloaded transformer; (3) an imbalanced load.

During normal fixture operation, if a transformer draws substantially more current than 80% of its maximum current rating it is overloaded. This will result in a shorter transformer service life and increase the possibility of impaired system performance due to changing fixture parameters.

During normal fixture operation, if a transformer draws substantially less current than 80% of its maximum current rating it is underloaded. This will also result in a shorter transformer service life and increase the possibility of impaired system performance due to changing fixture parameters.

Some luminous devices are configured to present a balanced load at the transformer secondary. This is done by various methods, such as arranging a plurality of luminous tubes in series, in parallel, or in series-parallel combinations at the secondary output of the transformer. If the load is not properly balanced at the time of installation, transformer service life will be shorter. Imbalanced loads also require greater power consumption in most cases since greater phase angle differences between the voltage and current result from the imbalance. For this reason, electrical units are often designed to present a balanced load to the power source. Such techniques are quite common in three-phase power systems, to which the present invention can be adapted.

Aside from installation defects, during normal operation a fixture is susceptible to the following fault conditions: (1) open circuits; (2) short circuits; (3) arcing; (4) power surges in the primary circuit; (5) transformer over-temperature conditions; and (6) degradation over service life.

The risk of fire is particularly present when arcing or a short circuit occurs. Fixture construction is such that a short circuit or an arc may not result in a failure of components or a loss of power. This means that a dangerous condition may persist for a considerable time after the fault occurs.

For a short circuit, considerable heat can be generated in the wires as the transformer attempts to drive the short. Depending on the heat dissipation capabilities of the transformer, power to the shorted secondary may be maintained for a considerable amount of time. The heat generated may cause nearby materials to ignite. Even if a fire does not result, eventually the transformer will fail. The technician may not be aware of the short circuit fault when replacing the transformer.

Arcing likewise may continue indefinitely. High secondary voltages can sustain electrical arcs up to several inches in length. When this occurs, nearby flammable or combustible materials could easily ignite.

The three remaining operating faults do not carry as high a risk of danger. However, it is still a great advantage to turn off primary power to the transformer when they occur.

Delivering power into an open circuited fixture shortens transformer service life and may injure an unsuspecting person who believes the fixture to be off. Also, arcing may occur at any time an open circuit exists, depending on the air gap dimensions and ambient conditions. Changes in temperature, humidity, etc. can cause an open circuit to start arcing.

Power surges can potentially harm both the transformer and the luminous device. They also present some risk of hazard due to large voltage and current spikes. It is an advantage to shut down power to the fixture as quickly as possible when a surge occurs.

Beyond a certain temperature it is both dangerous and damaging to operate a gaseous light fixture. The primary power should be shut down whenever the temperature exceeds this level.

Currently, a device which can detect and protect against operating faults is disclosed in commonly assigned application Ser. No. 07/580,957 entitled Luminous Tube Protection Circuit. Although this device can detect all five faults listed above, it does so differently than the present invention and it does not offer diagnostic information. It cannot shut off the primary power as quickly as can the diagnostic circuit protection device of the present invention.

The Luminous Tube Protection Circuit of the related application time-averages the sensed secondary output voltage, does not sense transformer primary current, and does not use an analog-to-digital converter, so it lacks many of the advantages of the present invention.

One advantage of the present invention is that it can shut off power to the transformer primary much more quickly than the Luminous Tube Protection Circuit can. This is true for any fault condition.

Another advantage is that the present invention senses transformer primary current as well as transformer secondary voltages. This allows for accurate diagnosis and subsequent indication of the fault condition.

The present invention simply divides and converts the voltage (and current) values using an analog-to-digital converter, yielding a direct representation of the sensed waveform at a given point in time. This captures more information about fixture operation than does the Luminous Tube Protection Circuit, which time averages the transformer secondary voltages.

The digital sensing method helps provide a faster shut-off of the primary power when a fault occurs. It allows real time processing of the sensed information, to facilitate shut-off and indication. Digital sensing also facilitates permanent storage of fault condition waveform histories, which are then available during diagnosis and repair.

Finally, the present invention has the advantage of being able to calibrate itself to the peculiarities of the particular load at the time of installation, or at any other time the technician decides to recalibrate the diagnostic circuit protection device of the invention.

Although the foregoing discussion and the subsequent disclosure center around the use of the diagnostic circuit protection device to protect a gaseous light fixture, one skilled in the art can easily apprehend its application with other electrical units.

SUMMARY OF THE INVENTION

The diagnostic circuit protection device according to the present invention ensures proper installation and operation of an electrical unit, reduces risks and hazards associated with a failure of an electrical unit, lowers replacement costs by ensuring proper power matching in an electrical unit, and expedites installation and repair by providing diagnostic information concerning the failure of an electrical unit.

The diagnostic circuit protection device of the invention is provided for use with electrical systems. The system comprises a power supply, an electrical unit or device, and optionally a matching device which matches the power supply to the electrical unit. The diagnostic circuit protection device senses a minimum of one voltage associated with the electrical system. Often, this will be the only measurement necessary to protect against system hazards. A minimum of one branch current in the system can also be measured in order to provide diagnostic fault information regarding the system. An ambient temperature may also be measured, to protect against over-temperature hazards. The diagnostic circuit protection device of the invention then monitors system operation and gives diagnostic indications in response to an analysis of the measured values.

A microcontroller is at the heart of a loop formed by the diagnostic circuit protection device circuitry. It coordinates the acquisition of digital values representative of at least one voltage, and optionally, additional voltage, current, and temperature values. These values are acquired at various times relative to a phase reference established by detecting a particular voltage value during a cycle of the voltage waveform, such as zero volts. The digital values are processed to determine the status of the electrical unit, and to switch the power supply on or off accordingly through driver circuitry. The microcontroller responds to operator commands from power and calibrate switches, and indicates fixture status by regulating the outputs of three LEDs.

The diagnostic circuit protection device of the present invention can protect against and indicate fault conditions during both the installation and the operation of electrical units.

During unit installation, overloading, underloading, and imbalanced loads can be detected and indicated. During unit operation, short circuit, open circuit, arcing, power surge, and device over temperature conditions can each be detected and indicated. Once detected, these faults are protected against by quickly cutting off power delivery from the power source. Digital representations of waveform values captured at the time of the fault condition are stored in non-volatile memory and can be accessed later for further diagnosis, if necessary.

These and other objects and advantages of the invention will become apparent from the following description of the preferred embodiment when read in conjunction with reference to the following drawings, wherein:

BRIEF DESCRIPTION OF THE DRAWINGS

FIG. 3 shows the primary voltage waveform of a transformer used as a matching device in a gaseous light fixture.

FIG. 4 shows a reactive load reduced secondary voltage waveform of a transformer used as a matching device according to the present invention with a luminous device as a load.

FIG. 5 shows a waveform indicative of the current in the primary coil of a transformer used as a matching device with a luminous device as a load.

DETAILED DESCRIPTION OF THE PREFERRED EMBODIMENT OF THE INVENTION

Figure 1A:
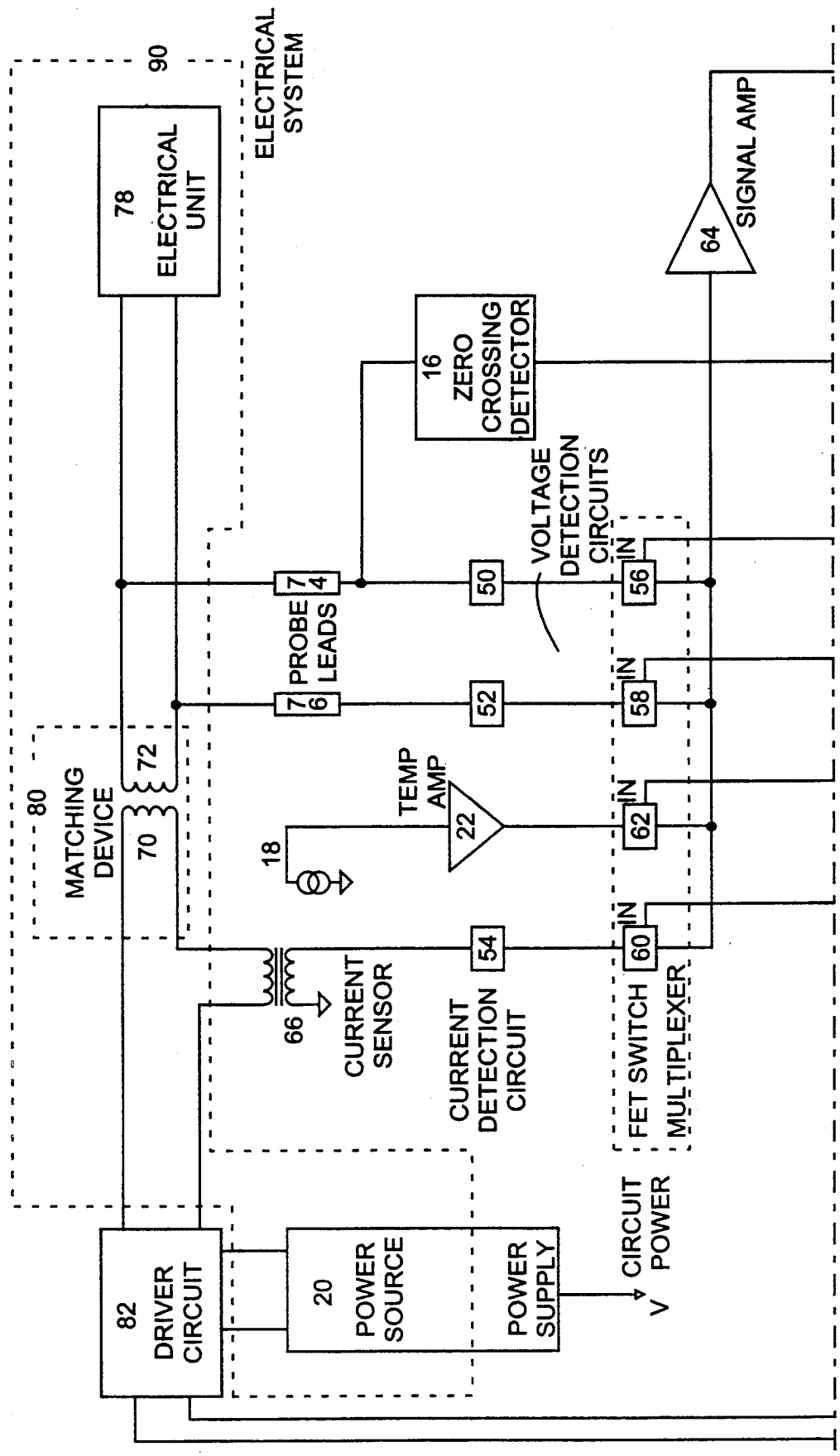
FIG. 1 shows a diagnostic circuit protection device according to the present invention connected to an electrical system with optional matching unit.
Figure 1B:
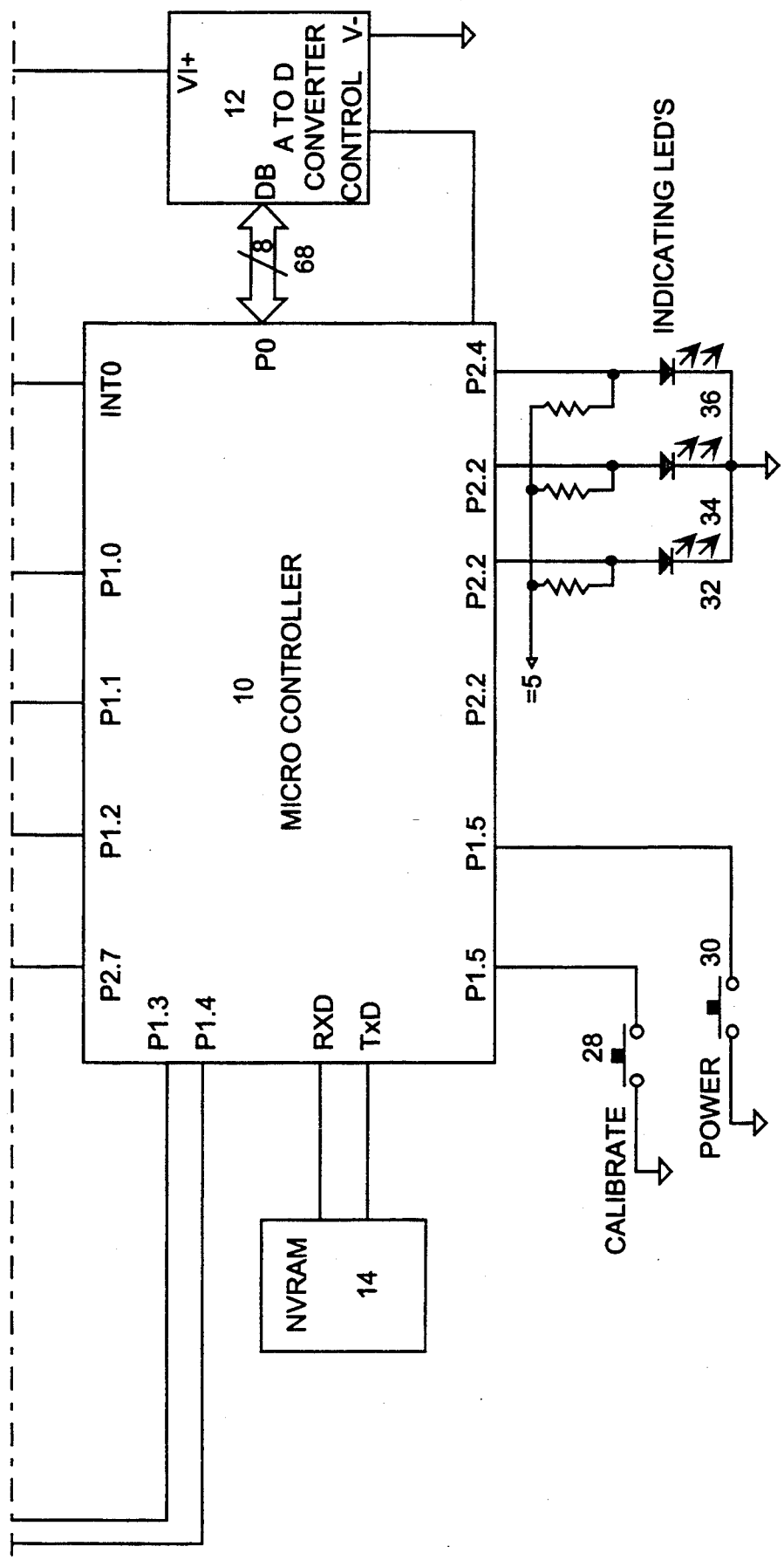
Figure 2A:
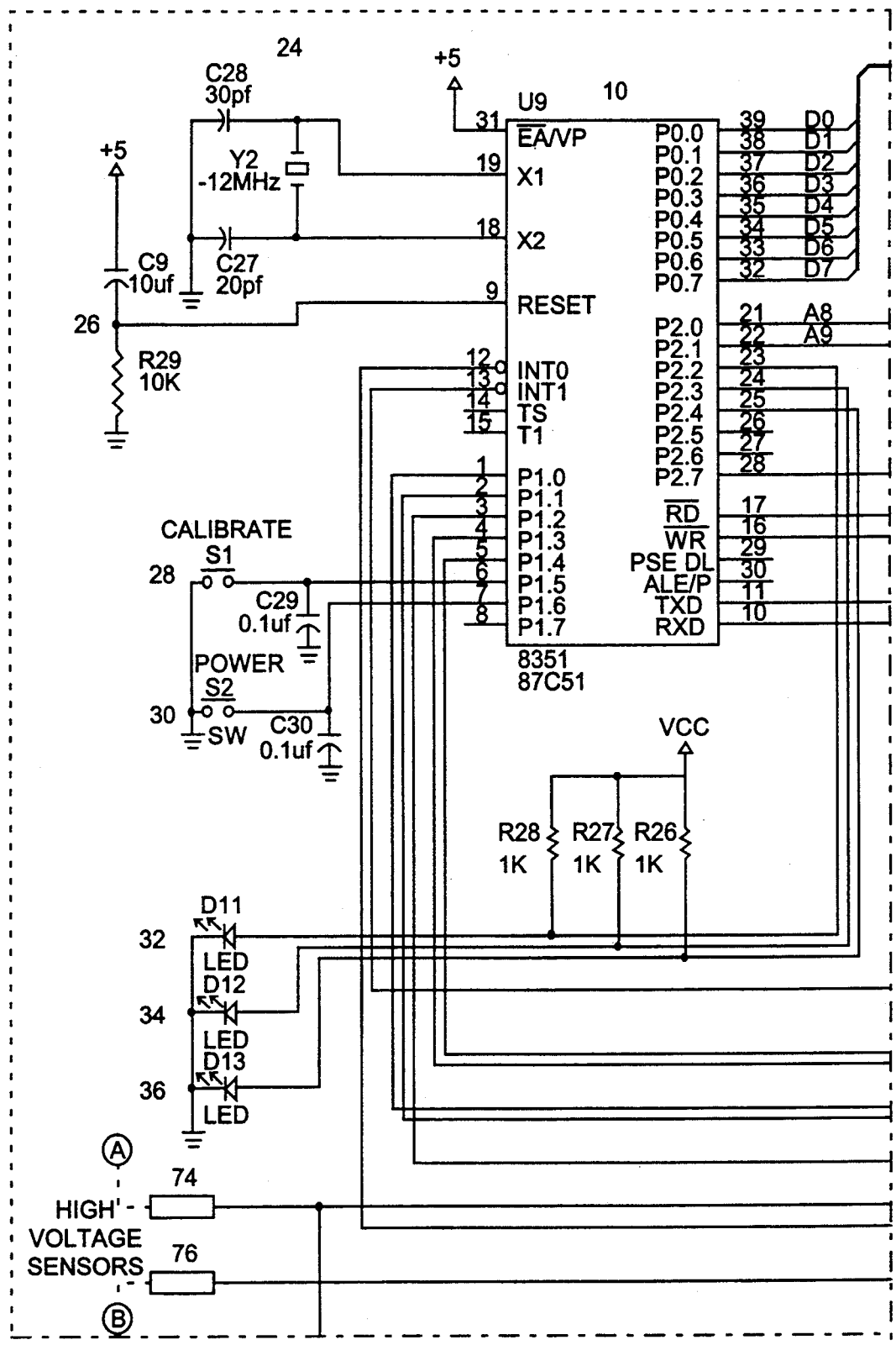
FIG. 2 shows a diagnostic circuit protection device according to the present invention connected to a gaseous light fixture.
Figure 2B:
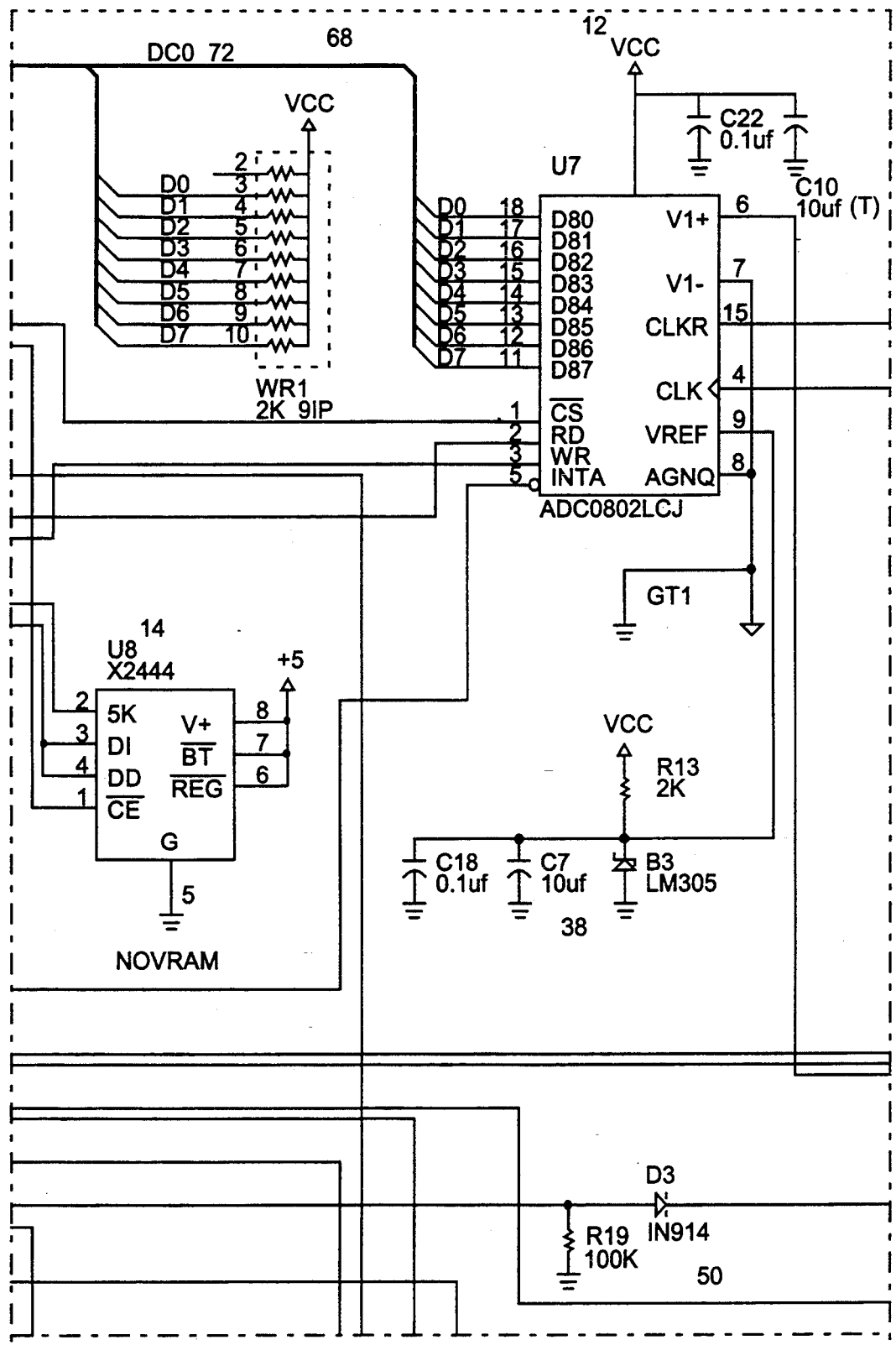
Figure 2C:
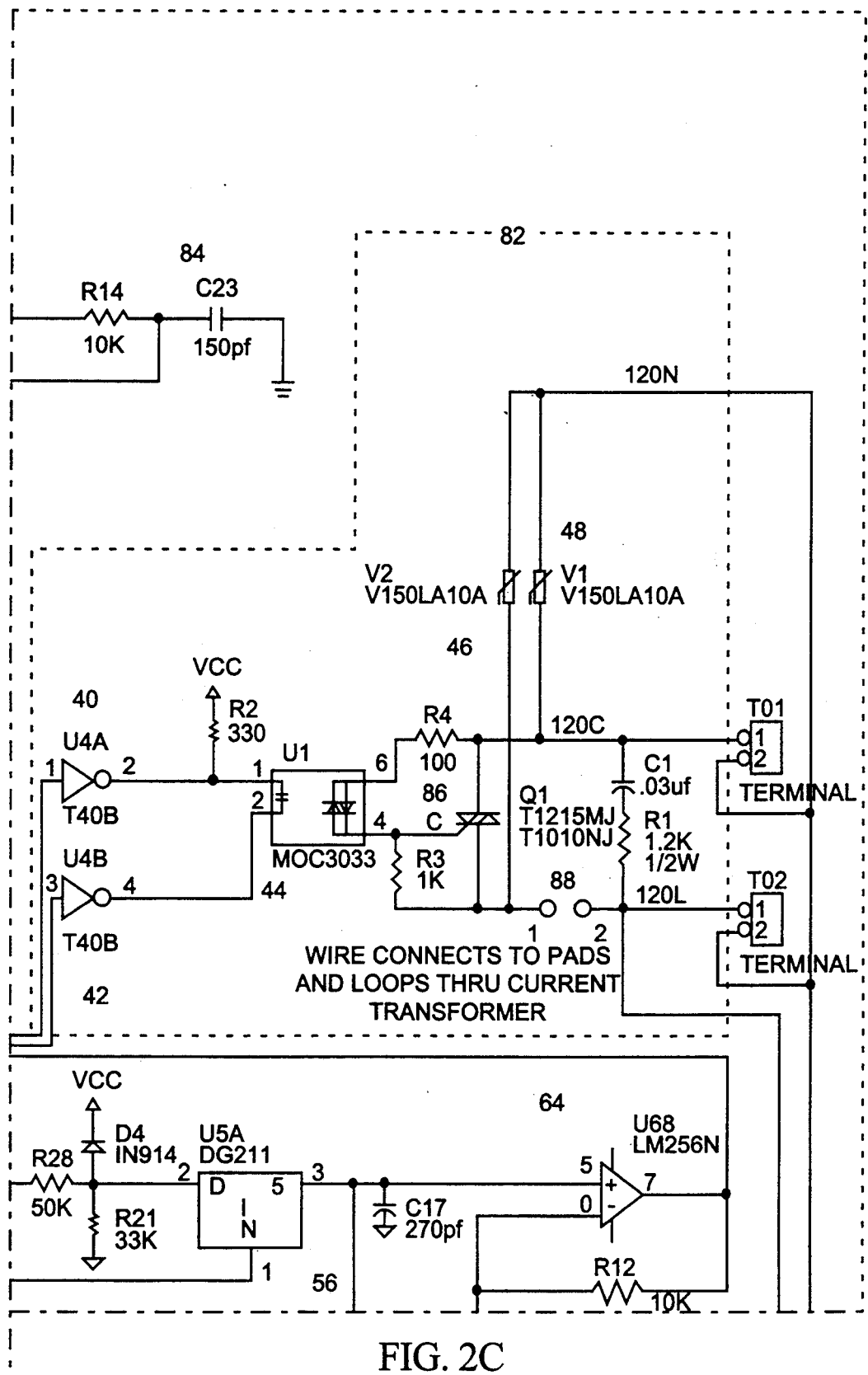
Figure 2D:
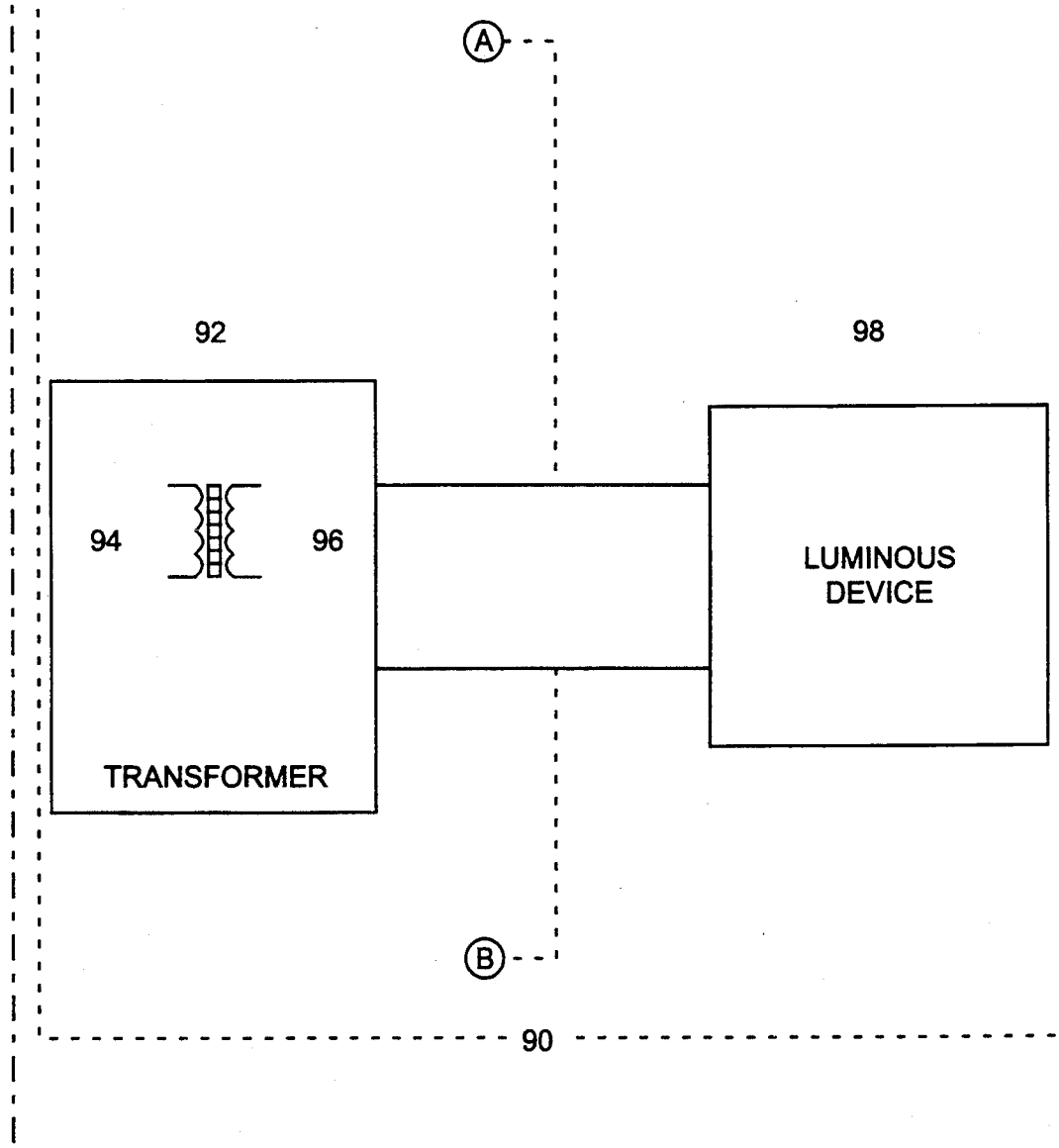
Figure 2E:
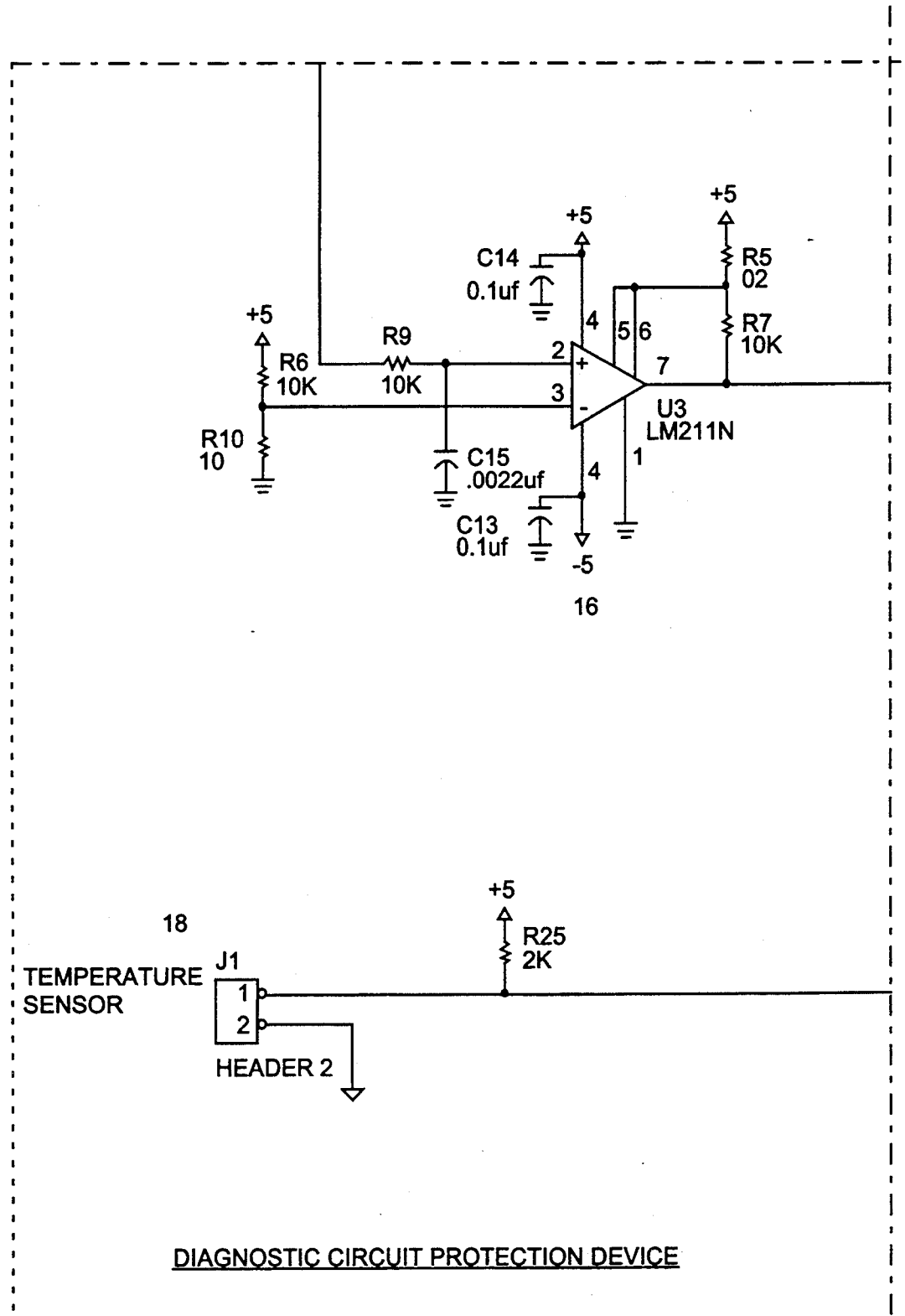
Figure 2F:
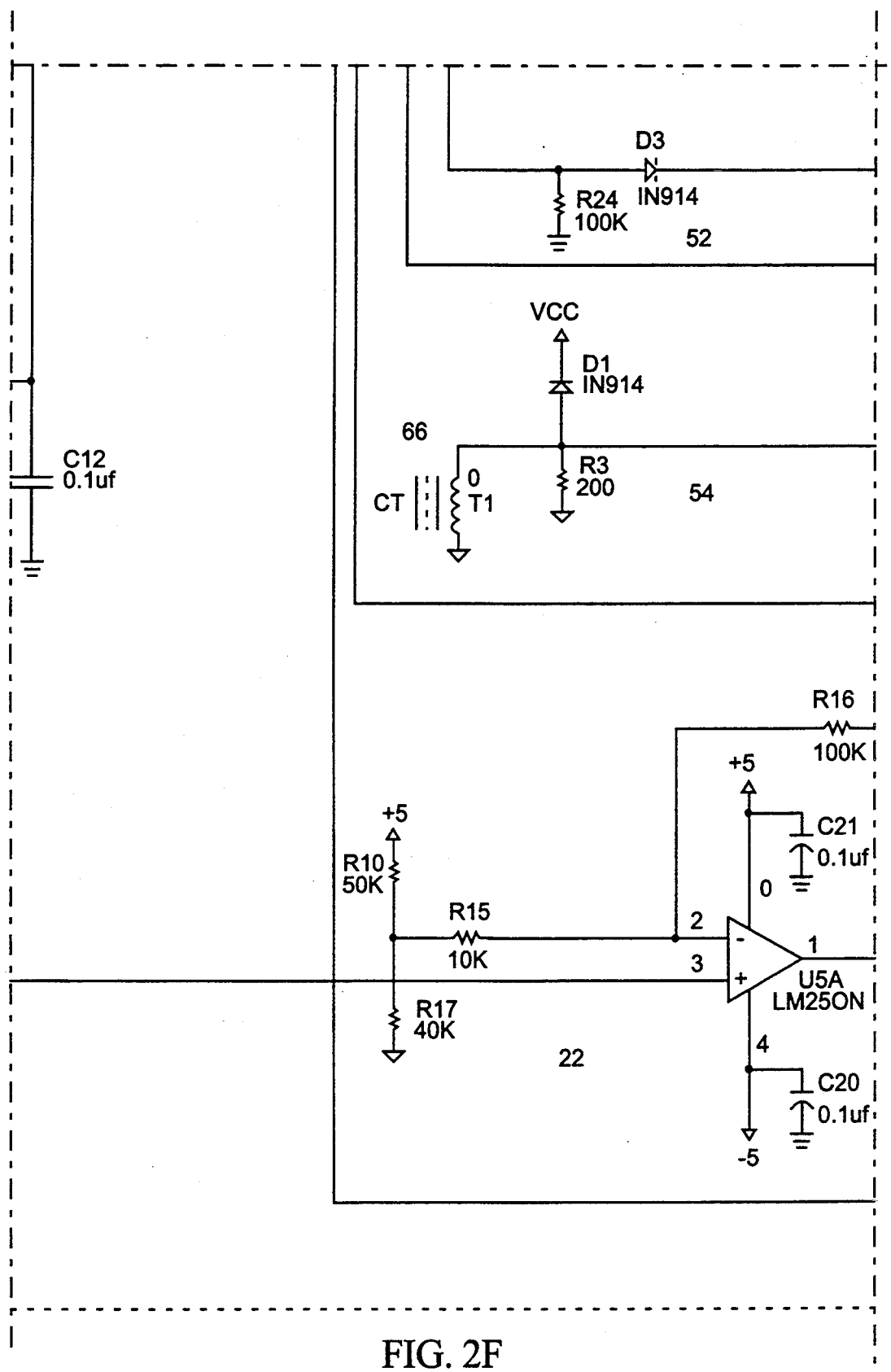
Figure 2G:
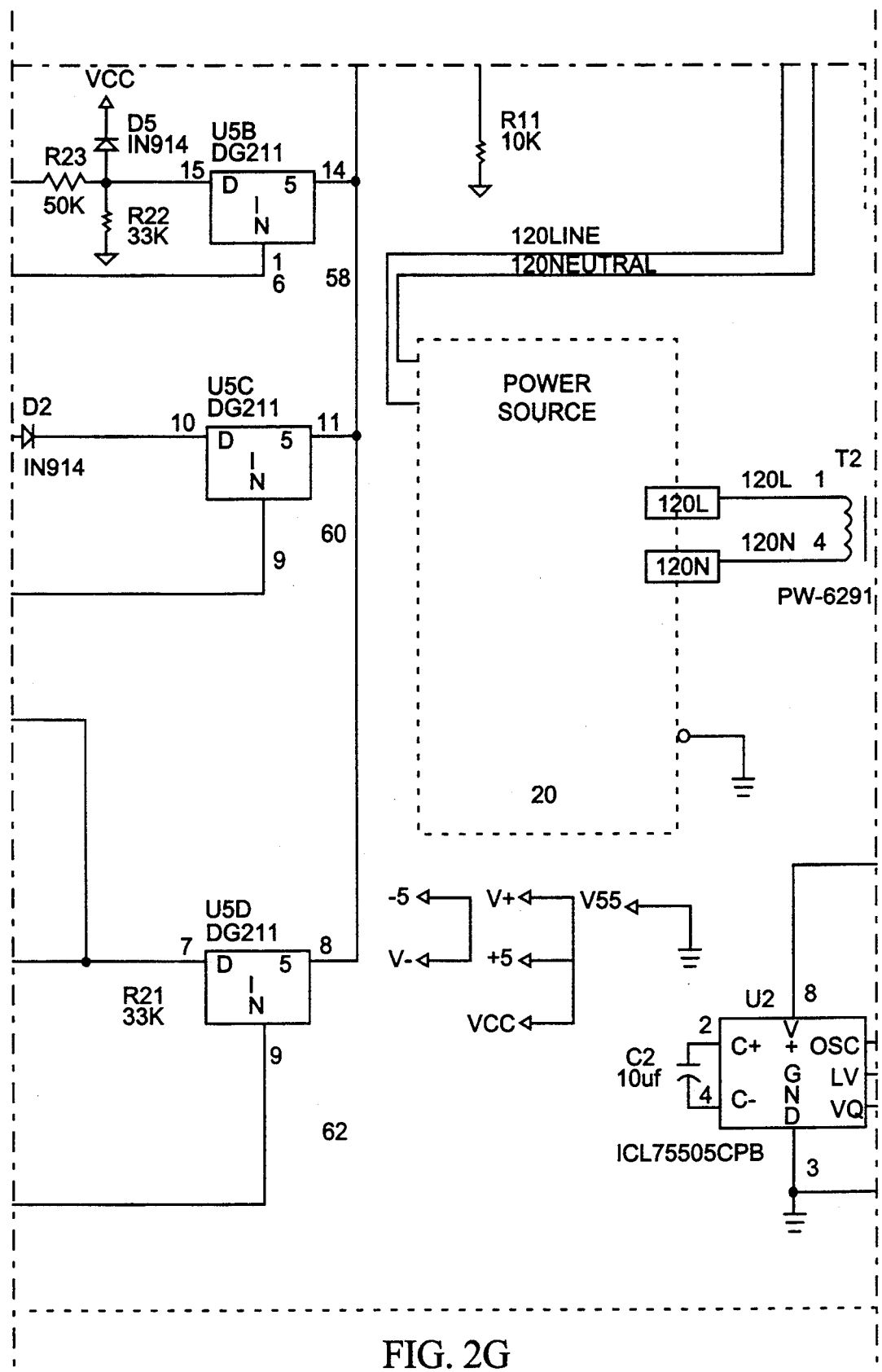
Figure 2H:
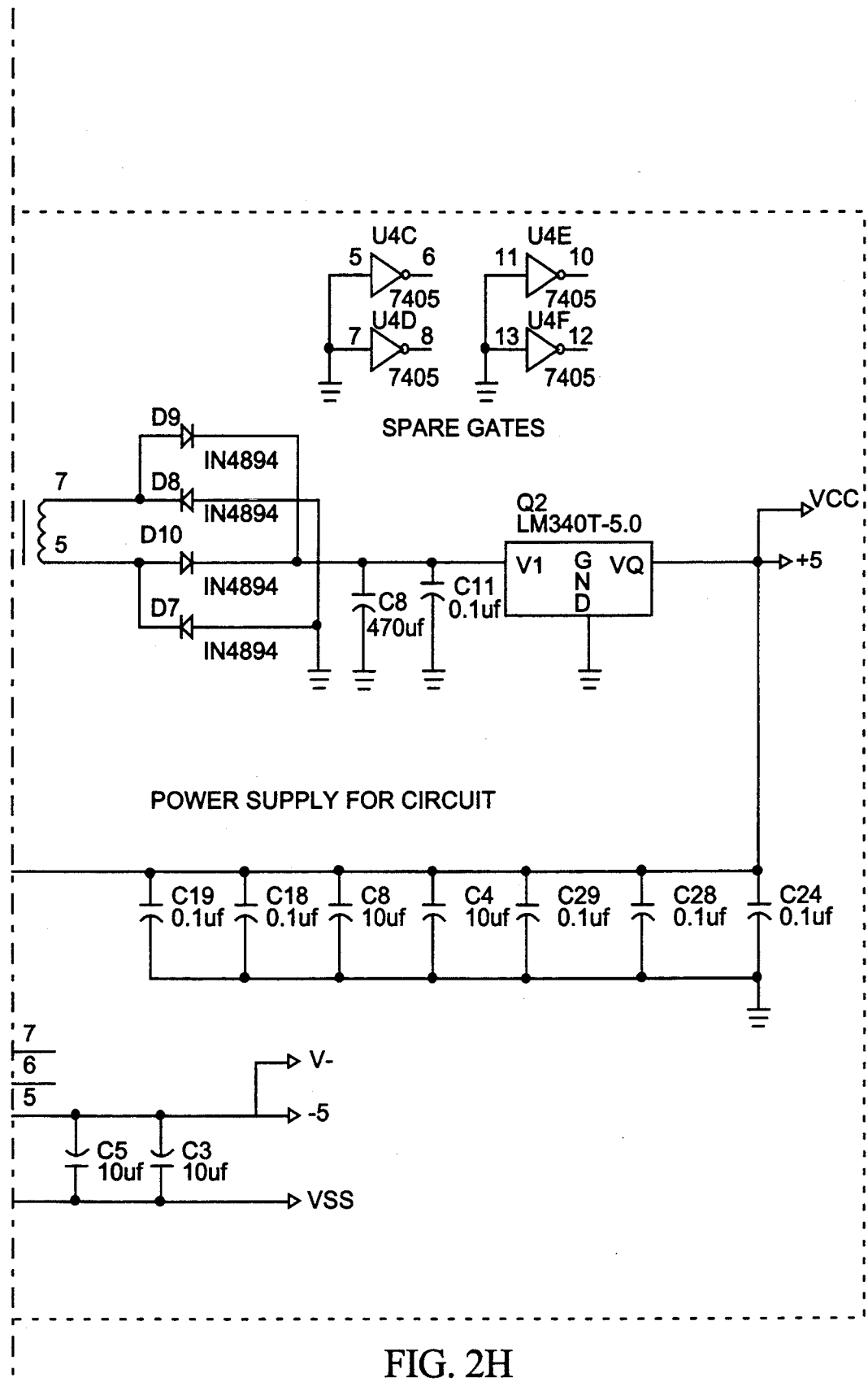

Referring now to FIG. 1, the diagnostic circuit protection device 100 constructed in accordance with the preferred embodiment comprises a microcontroller 10 that is at the heart of a loop in which the diagnostic circuit protection device 100 connects to an electrical system 90. Electrical system 90 comprises power source 20, matching device 80 which is optional to the system and not necessary to practice the present invention, and electrical unit 78. One skilled in the art will understand that the power supply 20 can be connected directly to electrical unit 78 under many circumstances. Matching device 80 is included for purposes of illustration in the present disclosure. Driver circuit 82 is interposed between power supply 20 and matching device 80 and is capable of switching the power supply to the electrical unit 78 on and off.

Microcontroller 10 connects to various elements of the diagnostic circuit protection device 100. It coordinates the operation of the device under program control. It has three input/output ports, P0, P1, and P2, which are bit addressable, meaning that each individual pin on these ports can be accessed under program control independently of the functions being provided by the other pins in the port. Microcontroller 10 includes internal RAM, a serial port, internal timers, a reset pin, interrupt pins, data pins, various control pins for coordinating peripheral circuits, and internal ROM for storing program instructions.

Probe leads 74 and 76 are comprised of conductors including high Megohm resistors and connect, respectively, from the matching device output 72 to voltage detection networks 50 and 52. The outputs of voltage detection networks 50 and 52 connect respectively to the inputs of digitally controlled switches 56 and 58.

A current transformer 66 determines the current in the branch circuit between driver circuitry 82 and matching device input 70. It connects at its output to current detection network 54. The output of current detection network 54 connects to the input of digitally controlled switch 60.

Temperature sensor 18 connects to temperature amplifier 22. The output of temperature amplifier 22 connects to the input of digitally controlled switch 62.

Digitally controlled switches 56, 58, 60 and 62 accept control inputs at their "IN" terminal from, respectively, pins P1.0, P1.1, P2.7, and P1.2 of microcontroller 10. The outputs from the digitally controlled switches are electrically connected to each other and are input into signal amplifier 64. This arrangement forms a multiplexer, allowing the microcontroller 10 to selectively connect any one of the four digitally controlled switch outputs to the input of signal amplifier 64.

Zero-crossing detector 16 connects to the output of probe lead 74. It provides an output signal to the interrupt zero pin, "INT0", of the microcontroller 10.

The output from signal amplifier 64 connects to the "VI+" input pin of analog-to-digital converter 12. The analog voltage at "VI+"is converted to a corresponding eight bit digital value. An eight line data bus 68 connects from the output of the A to D converter 12 to Port 0 of the microcontroller 10, so that the digital value can be transferred to microcontroller 10.

Nonvolatile RAM 14 connects to microcontroller 10 at its serial port pins, "RXD" and "TXD". It accepts values, under processor control, for safe storage in the event of a power down of the diagnostic circuit protection device 100.

Calibrate switch 28 and power switch 30 connect to the microcontroller 10 at pins P1.5 and P1.6, respectively. These switches provide operator control of the diagnostic circuit protection device 100.

Diagnostic indicating LEDs 32, 34, and 36 connect to pins P2.2, P2.3, and P2.4, respectively, of microcontroller 10, allowing it to indicate the present status of electrical unit 78.

Driver circuit 82 accepts input power from power supply 20 and accepts driver input signals from microcontroller pins P1.3 and P1.4. The driver turns the power supply to electrical unit 78 on or off at the command of microcontroller 10.

This configuration allows the diagnostic circuit protection device 100 to sense two voltage values associated with the electrical unit 78, one current value associated with the electrical unit 78, and one temperature value associated with the electrical system 90. However, it is not necessary that the present invention always connect to the electrical system 90 in the foregoing manner and sense information according to the foregoing description.

One skilled in the art would appreciate that the diagnostic circuit protection device 100 could be configured differently to protect the same or other devices, and that it could sense a single voltage, a single current, a plurality of voltages, a plurality of currents, or a combination of voltage and current values. These choices depend on the load and fault characteristics of the particular electrical unit 78 being protected. Similarly, the configuration of the components could be varied by one skilled in the art to achieve the same results. For example, multiple analog-to-digital converters could be used, eliminating the need for a multiplexer.

Referring now to FIG. 2, electrical system 90 is shown to be a gaseous light fixture, comprised of transformer 92, having primary coil 94 connecting through driver 82 to power source 20 and connecting to luminous tube 98 at its secondary coil 96. Note that transformer 92 acts as a matching device in this embodiment.

Resistors 74 and 76 are high Megohm resistors used to divide the high voltage from the transformer secondary 72 to a value suitable for input to voltage detector networks 50 and 52. Networks 50 and 52 in turn rectify and divide the voltage presented at the output of sensors 74 and 76, using diodes and resistors. The component values shown are representative values which are suitable for use with neon light fixtures. Component values will be different to accommodate different types of gaseous light fixtures, which have different magnitudes of transformer secondary voltage. Sensor and detection network values are chosen so that the output waveform of the signal amplifier 64 will have a peak-to-peak value between zero and five volts. Signal amplifier 64 is a standard operational amplifier which is well known in the art.

Current transformer 66 is a standard induction-type current sensing device, which puts out a voltage proportional to the current being measured. Current detection network 54 rectifies this output voltage, which appears across resistor R3.

Digitally controlled switches 56, 58, 60, and 62 are DG211 FET-type devices, or equivalent devices. Based on the digital value at their IN terminal, they either pass or block an analog signal across their D and S terminals. Since microcontroller 10 connects to the IN terminals, it can control which signal passes to signal amplifier 64, thus forming a multiplexer in conjunction with the digitally controlled switches 56, 58, 60 and 62.

Power source 20 provides standard single phase line and neutral power inputs at 120 Volts. However, the present invention is adaptable to work with many different power sources.

Driver circuitry 82 includes inverting buffers 40 and 42 which drive a standard zero-crossing driver 44 according to commands sent by the microcontroller 10. The zero-crossing driver 44 turns triac 86 on and off, when necessary, at zero-crossing points in the power cycle. Triac 86 is inserted in series with the transformer primary coil 94 and the leads from power source 20 so that it is capable of switching power to the transformer primary on or off based on inputs presented to the inverting buffers 40 and 42. Varistors 46 and 48 are standard variety metal-oxide varistors used to absorb high energy, short duration transients on the power lines. Snubber network 88, comprising capacitor cl and resistor R1, protects the triac 86 from being damaged while driving the inductive transformer load.

Still referring to FIG. 2, microcontroller 10 is preferably an Intel 8051 family device or equivalent device. It is a specialized microprocessor with its own instruction set and internal ROM and RAM capabilities. Crystal oscillator network 24 provides the reference for the internal clock. Power-up reset network 26 resets the microcontroller when power is applied to the circuit.

Analog-to-digital converter 12 is preferably an ADC 0802 or equivalent device. Voltage reference network 38 connects to the VREF pin to provide a reference voltage. RC network 84 connects to the CLK and CLKR pins, providing a free running clock for the converter. The VI- and AGND pins are tied to ground. The VI+ pin accepts the analog representative signal from the output of signal amplifier 64 for conversion to a digital value. Output pins DB0 through DB7 allow for transfer of the digital value to the microcontroller 10 over the data bus 68.

The analog-to-digital converter 12 has appropriate control lines which all connect to the microcontroller 10. The chip select pin connects to the pin P2.0 of the microcontroller so that the analog-to-digital converter 12 can be enabled when that pin goes low. The write pins of both chips are tied together, so that the microcontroller 10 can instruct the analog-to-digital converter 12 to begin a conversion. The interrupt pin INTR of the analog-to-digital converter 12 connects to the interrupt 1 pin INT1 of the microcontroller 10, so that it can flag the microcontroller 10 when a digital conversion is complete. Finally, the read control pins of both chips are connected together, so that the microcontroller can instruct the analog-to-digital converter 12 to send a converted value over the data bus 68.

One skilled in the art could easily add additional analog-to-digital converters or analog-to-digital converters of different resolution to the design by making appropriate connections among the control pins mentioned above.

Nonvolatile RAM 14 is a XICOR X2444 or equivalent device, also known as an EEPROM. Pins DI and DO are data pins. They are tri-stated and both connect to the receive data pin, RXD, of the microcontroller 10's serial port. Pin SK is the serial clock pin and it accepts a signal from the transmit data pin, TXD, of the microcontroller's serial port. The chip enable pin CE (bar) connects to pin P2.1 of the microcontroller 10, allowing it to send protocol instructions to the nonvolatile RAM 14. The store pin ST (bar) and the recall pin REC (bar) are unused and are tied high. This arrangement allows the microcontroller 10 and the nonvolatile ram 14 to exchange data serially.

Temperature sensor 18 is a semiconductor device, which puts out a voltage proportional to the ambient temperature.

Amplifiers 22 and 64 are common variety noninverting amplifiers using operational amplifiers and discrete components.

Zero-crossing detector 16 is a commonly known, positive going transition detector designed using a comparator and discrete components.

Power switch 30 and calibrate switch 28 are standard normally open switches. Diagnostic indicating LEDs 32, 34, and 36 are likewise standard components.

As mentioned before, one skilled in the art would recognize that various options are available in configuring the present invention. For instance, more analog-to-digital converters could be used, minimizing or eliminating the need to multiplex signals at the input of signal amplifier 64. Certainly, this change would require an increase in other circuitry, such as additional amplifiers, while decreasing or eliminating the need to provide digitally controlled switches. Also, the zero-crossing detector could be replaced with a circuit which performs the analogous function of establishing a phase reference, such as a peak detector. Also, a phase reference could conceivably be established by means of software or other digital processing of the converted voltage signal.

OPERATION

As previously described, in a preferred embodiment, the diagnostic circuit protection device 100 continuously senses (1) a first secondary voltage value; (2) a second secondary voltage value; (3) a primary current value; and (4) an ambient temperature value. The sensed values are either detected or amplified accordingly. A representative signal corresponding to each sensed value is input to the digitally controlled switches, 56, 58, 60, and 62. The representative signals are each available at the switch inputs at all times during operation. The conversion and storage of any representative value will now be discussed.

The microcontroller 10 turns on the appropriate digitally controlled switch 56, 58, 60, or 62 at a given time. Thus one of the representative values is amplified by signal amplifier 64 and input to the analog-to-digital converter 12. At a time based on the zero-crossing reference, microcontroller 10 outputs a signal on its WR (bar) pin, instructing the analog-to-digital converter 12 to start a conversion. The analog-to-digital converter 12 converts the instantaneous value of the representative signal present at its VI+ pin to an eight bit digital value.

When the conversion is complete, the analog-to-digital converter 12 generates an interrupt signal at its INTR pin to prepare microcontroller 10 to transfer the data. Microcontroller 10 receives this signal at its INT1 pin which causes its internal program to branch to an interrupt subroutine.

The subroutine causes microcontroller 10 to output a strobe signal on its RD (bar) pin and to bring pin P2.0 low. This enables the analog-to-digital converter 12 through its CS (bar) pin and instructs it to output the converted eight bit digital value onto the data bus 68.

The microcontroller 10 receives the eight bit digital value over data bus 68 and stores the value temporarily in its ram.

Thus, the microcontroller 10 coordinates the conversion and storage of a particular signal value at a particular time, using the zero-crossing detector 16 output to establish a phase reference to determine such timing. The description will now focus on operation with regard to both overall circuit function and to specific timing.

In a preferred embodiment, the diagnostic circuit protection device 100 is installed with a gaseous light fixture as shown in FIG. 2. If the device 100 has never been calibrated when power is applied, an indication to that effect will be output on the LEDs, 32, 34, and 36. Once calibrated with any fixture, the device 100 will not indicate that it is uncalibrated. The device 100 is calibrated at the time of installation according to the following procedure.

First a short circuit must be applied across the transformer secondary 96. Then the power switch 30 and the calibrate switch 28 must be pushed simultaneously. The diagnostic circuit protection device 100 will power-up and power-down automatically for about a ¼ second interval. During this time, digital samples are taken of the short circuit current flowing in the transformer primary coil 94, according to the protocol disclosed above. During the time short circuit current samples are taken, it is evident that digitally controlled switch 60 is on while the others are off. The microcontroller 10 then stores the short circuit current values in the nonvolatile ram 14, transmitting them via its serial port according to a communication protocol which is well known in the art.

At this point the technician will remove the short circuit from the secondary coil 96 and install the luminous device 98 across the transformer secondary 96. If the technician attempts to operate the diagnostic circuit protection device 100 without removing the short circuit, the device 100 will not allow power to be applied. LEDs 32, 34, and 36 will give an indication informing the technician that the short is still applied.

Once the luminous device 98 is properly installed, the technician may apply power to the device through power source 20. The technician will be prompted to push the calibration button 28 temporarily through an indication on LEDs 32, 34, and 36. During this time samples are taken of the first and second secondary coil voltages.

Referring to FIG. 4, a representative reactive load waveform is shown as would be observed by connecting an oscilloscope across the D input pins to digitally controlled switches 56 and 58 shown in FIG. 2. Actual waveforms will vary depending on the characteristics of the transformer 92, the luminous device 98, and the power source 20, as was discussed in the background of the invention. However, FIG. 4 is representative of a normal operating condition for a gaseous light fixture.

Still referring to FIG. 4, point "A" corresponds to the positive-going zero crossing point of the voltage on the transformer secondary coil 96. This is the event that triggers input zero-crossing detector 16, causing it to generate an interrupt signal which is received by microcontroller 10. The interrupt establishes a phase reference for the secondary coil waveform, to which microcontroller 10 refers when calculating the timing of ensuing activities.

When just the calibrate switch 28 is closed, as discussed above, the microcontroller 10 first waits for an interrupt from the zero-crossing detector. This is point "A" on FIG. 4. In the preferred embodiment, ringing can be seen to occur during the interval "A–B", which is approximately 3 milliseconds in duration. Ringing, although normal, will cause spurious error indications if voltage measurements are taken during this interval. Micro-controller 10 waits until slightly after point "B", and then begins the process of converting the first half-cycle voltage signal to a series of digital values as disclosed above. Between points "C" and "D", several voltage values may be taken. Perhaps eight to ten values will be converted and stored temporarily.

These values may be averaged or conditioned in other ways through digital processing within the microcontroller 10. In the preferred embodiment, they are averaged, and the average is then used to set a maximum and minimum fault limit in the following way. The microcontroller 10 is preprogrammed, according to the electrical system at hand, with an upper voltage fault tolerance value and a lower voltage fault tolerance value. These values are multiplied by the average value previously obtained during calibration. The products of these multiplications are added and subtracted respectively from the averaged calibration value, and the results are stored in non-volatile RAM 14 as the maximum and minimum allowable fault limits for secondary voltage during electrical unit operation.

This process is repeated for the second half-cycle of the secondary coil voltage waveform, with digital values being converted during interval "G–H". At this point however, the microcontroller is now prepared to compare the symmetry of the waveform by comparing its sampled values for each half-cycle, or by comparing the average sample value for each half-cycle. An asymmetry in the values obtained indicates that the luminous device 98 (the load) is imbalanced. When this is the case, the microcontroller 10 is programmed to turn off the power to the fixture through driver circuit 82, and to indicate an imbalanced condition to the technician through the LEDs 32, 34, and 36. The technician can then exercise the option of running the fixture with the in balance or correcting the imbalance and starting the calibration process from the beginning. The degree to which imbalance is tolerated by the diagnostic circuit protection device 100 is subject to values which are preprogrammed based on the characteristics of the electrical system 90.

Note that the present invention is capable of performing its protection function solely by sampling a single half-cycle of the secondary voltage waveform, since all of the fault conditions will cause an out-of-tolerance condition of each half-cycle voltage. Both half-cycles are measured, however, to promote fast shut-off when a failure occurs and to allow for the detection of imbalanced loads during installation or operation.

Still referring to FIG. 4, a symmetrical waveform such as the one depicted will not cause the microcontroller 10 to indicate an imbalance failure. However, referring to FIG. 5, the microcontroller 10 may utilize interval "A–B", interval "E–F", or both, to obtain digital representations of the current in the transformer primary 94, utilizing the current transformer 66 and associated circuitry shown in FIG. 2 and described above. Several current values may be obtained during such sampling, from which the maximum value may be discovered by the program of the micro-controller 10. This maximum is usually the peak current value. The microcontroller 10 compares this value with the short circuit current value stored in the non-volatile RAM 14 to determine whether the transformer 92 is overloaded or underloaded. The comparison is again based on pre-programmed values which depend on the electrical system 90 which is being protected. For gaseous light fixtures, acceptable currents are considered to be in the range of 75% to 85% of the short circuit current value.

When an overload or underload condition is detected, the microcontroller will shut-off the power through driver circuitry 82 and will indicate the appropriate failure message on LEDs 32, 34, and 36. The technician can then exercise the option of replacing the transformer 92 with a more appropriate choice or of operating the fixture under the less than ideal matching conditions.

Assuming that the diagnostic circuit protection device 100 does not detect an overload, underload, or imbalance during calibration, it will then automatically advance to its protection mode.

The microcontroller 10 coordinates the acquisition of digital sample values in the same manner as described above. Since the current in the transformer primary 94 is out of phase with the secondary voltage, it is converted during an interval which is appropriate to allow adequate samples of all three values to be taken during a single power cycle.

Just as above, the values may be averaged or conditioned in other ways. In the preferred embodiment, the half-cycle voltage samples are averaged while the current samples are analyzed for a maximum value. Comparisons with stored values are made just as described above, during each half-cycle of the power signal. This facilitates shut-off by the next zero-crossing of the primary coil 94 voltage waveform.

Microcontroller 10 also samples the ambient temperature value at convenient times during each cycle of the power signal, although temperature measurements are not critical to the innovation embodied in the present invention.

The diagnostic circuit protection device 100 detects and indicates faults in the following ways.

When both first and second sensed secondary voltages are above the stored voltage calibration values, plus some threshold tolerance, and the sensed primary current value is below the stored current value minus some tolerance, an open condition is indicated and power is shut down.

When both first and second sensed secondary voltages are below the stored voltage calibration values, minus some threshold tolerance, and the sensed primary current value is well above or well below the stored current value, plus or minus some tolerance, respectively, a short condition is indicated and power is shut down.

When one of the sensed secondary voltages is within the tolerance window range of its stored voltage calibration value, but the other sensed secondary voltage is outside its tolerance window with respect to the stored value, and the sensed current value is outside its tolerance window, then an arcing condition is indicated and the power is shut down.

Above a certain temperature it becomes dangerous to operate a luminous device 98, so the power is shut down.

Whenever the power is shut down, the microcontroller 10 invokes a time delay of approximately ten seconds, and then attempts to power up the luminous device 98 once more. This is done to avoid permanent shut downs due to temporary fault or other conditions such as power spikes, etc. If the fault has a temporary cause, the luminous device 98 will be allowed to operate guarded by the normal protection mode of the diagnostic circuit protection device 100. If the fault has a persisting cause, the device 100 will shut down power after its power up attempt and keep power off until the electrical system is attended to by a technician.

According to an alternative embodiment of the present invention, the digital processing device 10, instead of receiving a calibration signal, receiving a digital value when the calibration signal is received, and then calculating error limits based on the digital value, may be adapted internally to periodically establish a calibration value, and then to calculate an error limit based on the calibration value. This would allow the error limit to reflect past operating characteristics and be automatically updated or adjusted based on predetermined criteria, as applied to that operating history.

The logic and code for the software embodied in the digital processing device of the present invention is attached hereto as Appendix "A," and is incorporated herein and made a part hereof for all purposes.

While preferred and alternative embodiments of the invention have been shown and described, many modifications thereof may be made by those skilled in the art without departing from the spirit of the invention. Therefore, the scope of the invention should be determined in accordance with the following claims.

We claim:

1. A circuit protection device, comprising:
   a driver circuit adapted during use for connection between an electrical unit and an AC power source;
   a detection circuit adapted for connection to said electrical unit for sensing a fault condition of said electrical unit within one half-cycle of said AC power source; and
   a digital processing device coupled between said detection circuit and said driver circuit, for receiving a digital representation of said fault condition and for disconnecting said AC power source from said electrical unit during times in which a value of said digital representation is outside a pre-programmed range of values stored with said digital processing device.

2. A circuit protection device as in claim 1, wherein said detection circuit comprises a voltage detection circuit.

3. A circuit protection device as in claim 1, wherein said detection circuit comprises a current detection circuit.

4. A circuit protection device as in claim 3, wherein said current detection circuit comprises a current transformer.

5. A circuit protection device as in claim 1 wherein:
   wherein said detection circuit comprises a temperature detection circuit.

6. A circuit protection device as in claim 5, wherein said temperature detection circuit comprises:
   a temperature sensor capable of providing an output indicative of an ambient temperature at its location;
   a temperature amplifier capable of receiving said output from said temperature sensor and providing an amplified output signal.

7. A circuit protection device as in claim 1, further comprising a matching device coupled between said driver circuit and said electrical unit, said matching device comprising a transformer having primary and secondary coils.

8. A circuit protection device as in claim 1, wherein said digital processing device is connected to a switch such that during activation of said switch, said switch is adapted for producing a digital value to said digital processing device and said digital processing device is adapted for calculating said range of values for said electrical unit and for utilizing said range of values for detecting said fault condition.

9. A circuit protection device as in claim 8, wherein said digital processing device is adapted for periodically establishing a calibration value, and wherein said digital processing device calculates an error limit based on said calibration value can utilizes said error limit to detect errors.

10. A circuit protection device as in claim 1, further comprising a non-volatile RAM connected to said digital processing device for recording and storing digital values while power to said electrical unit is off.

11. A circuit protection device as in claim 1, wherein said digital processing device provides an output signal to a display unit to indicate a particular error detected.

12. A circuit protection device as claimed in claim 1, wherein:
   said digital processing device comprises a microcontroller; and
   said driver circuit comprises a triac switch driven by a zero-crossing detector.

13. A circuit protection device as in claim 1, wherein power to said electrical unit is shut off within one cycle of said AC power source, from the time of said fault detection.

14. A circuit protection device as in claim 1, wherein said detection circuit comprises a current detection circuit and a plurality of voltage detection circuits.

15. A circuit protection device as in claim 1, further comprising a display unit coupled to said digital processing device, capable of displaying a condition of operation of said electrical unit and said circuit protection device.

16. A circuit protection device as in claim 1, further comprising a multiplexer circuit coupled to said detection circuit, capable of selectively allowing one of a plurality of signals to be processed.

17. A circuit protection device as in claim 1, further comprising a phase reference coupled between said voltage detection circuit and said digital processing device, said phase reference comprising a zero-crossing detector.

18. A method of protecting an electrical unit which receives operating power in the form of a periodic signal, using a digital processing device, comprising:
- (A) providing said digital processing device with a data base for said electrical unit comprising,
  - (1) a voltage fault tolerance value for a voltage associated with said electrical unit,
- (B) calibrating the digital processing device by
  - (1) digitally sampling said voltage to obtain a digital calibration value;
  - (2) calculating within said digital processing device a voltage fault limit based on said digital calibration value and said voltage fault tolerance value; and
- (C) performing the following steps within each period of said periodic signal during operation of the electrical unit,
  - (1) digitally sampling said voltage associated with said electrical unit at frequent intervals to obtain a series of representative digital voltage values;
  - (2) providing said digital processing device with said representative digital voltage values;
  - (3) determining, within said digital processing device, whether said representative digital voltage values have surpassed said voltage fault limit;
  - (4) switching off said operating power whenever said determination indicates that said voltage fault limit has been surpassed.

19. A method of protecting an electrical unit as in claim 18, further comprising:
- (A) providing said digital processing device with a data base for said electrical unit further comprising,
  - (1) an upper and lower voltage fault tolerance value for a voltage associated with said electrical unit,
- (B) calibrating the digital processing device by,
  - (1) digitally sampling said voltage under normal operating conditions to obtain a digital calibration value;
  - (2) calculating within said digital processing device an upper voltage fault limit based on said digital calibration value and said upper voltage fault tolerance value; and
  - (3) calculating within said digital processing device a lower voltage fault limit based on said digital calibration value and said lower voltage fault tolerance value;
- (C) performing the following steps within each period of said periodic signal during operation of the electrical unit,
  - (1) digitally sampling said voltage associated with said electrical unit at frequent intervals to obtain a series of representative digital voltage values;
  - (2) providing said digital processing device with said representative digital voltage values;
  - (3) determining, within said digital processing device, whether said representative digital voltage values have exceeded said upper voltage fault limit;
  - (4) determining, within said digital processing device, whether said representative digital voltage values have not exceeded said lower voltage fault limit;
  - (5) switching off said operating power whenever one of said determinations at steps (3) and (4) indicates that one of said voltage fault limits has been surpassed.

20. A method of protecting an electrical unit as in claim 19, wherein steps (C)(3) and (C)(4) further comprise:
setting an error flag whenever one of said determinations indicates that one of said upper and lower voltage fault limits has been surpassed.

21. A method of protecting an electrical unit as in claim 18, wherein step (C)(3) further comprises:
setting an error flag whenever the determination indicates that said voltage limit has been surpassed.

22. A method of protecting an electrical unit which receives operating power in the form of a periodic signal, using a digital processing device, comprising:
- (A) providing said digital processing device with a data base for said electrical unit comprising at least,
  - (1) a maximum voltage fault limit for said electrical unit,
  - (2) a minimum voltage fault limit for said electrical unit,
  - (3) a maximum current rating for said electrical unit;
- (B) performing the following steps within each period of said periodic signal,
  - (1) digitally sampling a voltage at a node associated with said electrical unit at frequent intervals to obtain a series of representative digital voltage values;
  - (2) digitally sampling a current in a branch circuit associated with said electrical unit at frequent intervals to obtain a series of representative digital current values;
  - (3) providing said digital processing device with said representative digital voltage values and with said representative digital current values;
  - (4) determining, within said digital processing device, whether any of said representative digital voltage values has exceeded said maximum voltage fault limit or whether any of said representative digital voltage values has fallen below said minimum voltage fault limit;
  - (5) switching off said operating power and setting an overvoltage flag whenever said determination indicates that said maximum voltage fault limit has been exceeded;
  - (6) alternatively, switching off said operating power and setting an undervoltage flag whenever said determination indicates that said minimum voltage fault limit has not been exceeded.

* * * * *